United States Patent
Abedifard et al.

(10) Patent No.: US 7,068,560 B2
(45) Date of Patent: Jun. 27, 2006

(54) HIGH SPEED LOW VOLTAGE DRIVER

(75) Inventors: Ebrahim Abedifard, Sunnyvale, CA (US); Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 58 days.

(21) Appl. No.: 10/932,413

(22) Filed: Sep. 2, 2004

(65) Prior Publication Data

US 2005/0024937 A1 Feb. 3, 2005

Related U.S. Application Data

(62) Division of application No. 10/227,965, filed on Aug. 26, 2002, now Pat. No. 6,809,960.

(51) Int. Cl.
*G11C 7/00* (2006.01)
(52) U.S. Cl. .................................. 365/226; 365/185.23
(58) Field of Classification Search ................ 365/226, 365/185.01, 185.23, 185.18, 189.01, 189.09
See application file for complete search history.

(56) References Cited

U.S. PATENT DOCUMENTS

| | | | |
|---|---|---|---|
| 5,165,046 A | 11/1992 | Hesson | |
| 5,329,210 A | 7/1994 | Peterson et al. | |
| 5,424,690 A | 6/1995 | Ohno | |
| 5,587,951 A | 12/1996 | Jazayeri et al. | |
| 5,627,487 A | 5/1997 | Keeth | |
| 5,670,905 A | 9/1997 | Keeth et al. | |
| 5,760,621 A | 6/1998 | Keeth | |
| 5,767,729 A | 6/1998 | Song | |
| 5,991,198 A | 11/1999 | Song et al. | |
| 6,069,519 A | 5/2000 | Song | |
| 6,269,026 B1 * | 7/2001 | Venkatesh et al. | 365/185.29 |
| 6,507,523 B1 * | 1/2003 | Pekny | 365/189.09 |
| 6,597,603 B1 | 7/2003 | Lambrache et al. | |
| 6,646,950 B1 | 11/2003 | Akaogi | |

* cited by examiner

*Primary Examiner*—Anh Phung
(74) *Attorney, Agent, or Firm*—Leffert Jay & Polglaze, P.A.

(57) ABSTRACT

A high speed high and low voltage driver provides an output voltage without taxing a pumped voltage. The pumped voltage is used only when the output node has risen substantially to a supply voltage without draining the pumped voltage.

23 Claims, 2 Drawing Sheets

HIGH SPEED LOW VOLTAGE DRIVER

RELATED APPLICATIONS

This is a divisional application of U.S. patent application Ser. No. 10/227,965 filed Aug. 26, 2002, now U.S. Pat. No. 6,809,960, issued on Oct. 26, 2004, titled "High Speed Low Voltage Driver" and commonly assigned, the entire contents of which is incorporated herein by reference.

FIELD

The present invention relates generally to memory devices and in particular the present invention relates to drivers for memory circuits.

BACKGROUND

Memory devices are available in a variety of styles and sizes. Some memory devices are volatile in nature and cannot retain data without an active power supply. A typical volatile memory is a DRAM which includes memory cells formed as capacitors. A charge, or lack of charge, on the capacitors indicate a binary state of data stored in the memory cell. Dynamic memory devices require more effort to retain data than non-volatile memories, but are typically faster to read and write.

Non-volatile memory devices are also available in different configurations. For example, floating gate memory devices are non-volatile memories that use floating gate transistors to store data. The data is written to the memory cells by changing a threshold voltage of the transistor and is retained when the power is removed. The transistors can be erased to restore the threshold voltage of the transistor. The memory may be arranged in erase blocks where all of the memory cells in an erase block are erased at one time. These non-volatile memory devices are commonly referred to as flash memories.

The non-volatile memory cells are fabricated as floating gate memory cells and include a source region and a drain region that is laterally spaced apart from the source region to form an intermediate channel region. The source and drain regions are formed in a common horizontal plane of a silicon substrate. A floating gate, typically made of doped polysilicon, is disposed over the channel region and is electrically isolated from the other cell elements by oxide. For example, gate oxide can be formed between the floating gate and the channel region. A control gate is located over the floating gate and can also made of doped polysilicon. The control gate is electrically separated from the floating gate by another dielectric layer. Thus, the floating gate is "floating" in dielectric so that it is insulated from both the channel and the control gate.

In high performance flash memories, such as synchronous flash memories, large loads are selected in the memory array during a read or write cycle. These loads must be selected in a very short time. Further, as components continue to shrink, and as operating power continues to decrease, components that consume less power are also needed. In high performance memories, on each bitline of a memory array, there are gates for access transistors. In modern memories, there are on the order of 4000 bitlines. Each bitline has a pass transistor between a global bitline and the local bitline that is turned on for memory access in an active cycle of the memory. Turning on 4000 transistors creates a large capacitance that is turned on and off during each shift from bank to bank of a memory array during a read cycle of the memory. Typically, this row activation occurs every 20 nanoseconds. This can consume on the order of 10 or more milliamps of current.

A pumped voltage circuit supplies a voltage $V_{px}$ for the gates of the pass transistors. This pumped voltage uses a supply voltage for the memory as its source. As supply voltages continue to drop, presently to on the order of 1.6 to 1.8 volts, pumping $V_{px}$ to about 5 volts becomes increasingly less power efficient, especially if there is a current drain due to the large capacitance of 4000 bitline transistors, since $V_{px}$ is a pumped voltage and not a supply voltage. This pumped voltage is quickly drained of an unacceptable amount of current if it is used to supply the current required for loading 4000 bitlines. To supply 10 milliamps from the pumped voltage circuit requires on the order of 30 milliamps from $V_{cc}$, which yields very low power efficiencies. The current that gets used for $V_{px}$ is very expensive.

The gates on the pass transistors need to be pulled up to $V_{cc}$ quickly to allow gate selection and activation within the very short time periods used in flash memories. Once a potential at or near $V_{cc}$ is present at the gates, they need to be raised to a voltage slightly above $V_{cc}$, but time is not as critical for the final increase.

For the reasons stated above, and for other reasons stated below which will become apparent to those skilled in the art upon reading and understanding the present specification, there is a need in the art for a driver that does not tax the current of a pumped gate voltage supply.

SUMMARY

The above-mentioned problems with gate selection and power consumption in flash memories and other problems are addressed by the present invention and will be understood by reading and studying the following specification.

In one embodiment, a driver for a memory array includes an enable circuit providing an enable signal, a pull down transistor having its gate connected to the enable signal to ground an output node when the enable signal is disabled, and a pass transistor having its gate connected through a first p-type pull-up transistor connected between a pumped voltage and the gate of the pass transistor. An inverter is connected between the enable circuit output and the pass transistor, and a second pull down transistor is connected between ground and the gate of the pass transistor. Two inverters are coupled in series between the output of the first inverter and the gate of the second pull down transistor. A second p-type transistor is connected between the pumped voltage and the output node, the gate of the second p-type transistor connected to the gate of the pass transistor.

In another embodiment, a driver for a memory array pass transistor block includes a first path for providing a supply voltage to an output node upon initiation of a read cycle, and a second path for providing a pumped voltage to the output node after the output node receives the supply voltage, where the pumped voltage is greater than the supply voltage.

In yet another embodiment, a memory device includes an array of memory cells, control circuitry to read, write and erase the memory cells, and a driver circuit to control read access. The driver circuit includes a first path for providing a supply voltage to the output upon initiation of a read cycle, and a second path for providing a pumped voltage above the supply voltage after providing the supply voltage.

In still another embodiment, a flash memory device includes an array of floating gate memory cells, control circuitry to read, write and erase the floating gate memory cells, and a driver circuit to control read access. The driver circuit includes a NAND gate providing a read signal, a pull down transistor having its gate connected to the read signal, to ground an output node when the read signal is disabled, a pass transistor having its gate connected through a first p-type pull-up transistor connected between a pumped voltage and the gate of the pass transistor, an inverter connected between the NAND gate output and the pass transistor, a second pull down transistor connected between ground and the gate of the pass transistor, a series connection of two inverters connected between the output of the first inverter and the gate of the second pull down transistor, and a second p-type transistor connected between the pumped voltage and the output node, the gate of the second p-type transistor connected to the gate of the pass transistor.

In yet another embodiment, a method of operating a circuit includes holding an output node at a low potential, and maintaining a pass transistor ready to supply the output node with a high potential during a read cycle. A supply voltage is passed to the output node without using a pumped voltage upon initiation of the read cycle, and a pumped voltage is passed to the output node to elevate the output node voltage above the supply voltage once the output node reaches the supply voltage.

In still yet another embodiment, a method of operating a read cycle in a memory includes supplying an output voltage to the gates of an array of pass transistors of a memory array, the output voltage ramped to a supply voltage without using a pumped voltage, and raised above a supply voltage with a pumped voltage.

In another embodiment, a method of providing a gate voltage for pass transistors of a memory array includes providing a supply voltage substantially immediately upon initiation of a read cycle, and delaying supplying a pumped voltage to raise the gate voltage above the supply voltage until the gate voltage has reached the supply voltage.

Other embodiments are described and claimed.

DETAILED DESCRIPTION

Figure 1A:
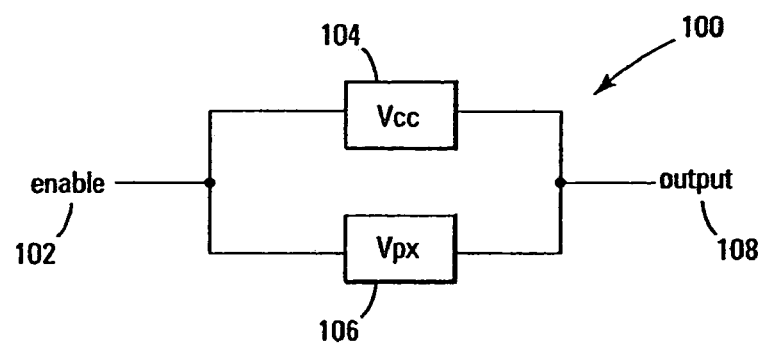
FIG. 1A is a block diagram of an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

In addition, as the structures formed by embodiments in accordance with the present invention are described herein, common semiconductor terminology such as N-type, P-type, N+ and P+ will be employed to describe the type of conductivity doping used for the various structures or regions being described. The specific levels of doping are not believed to be germane to embodiments of the present invention; thus, it will be understood that while specific dopant species and concentrations are not mentioned, an appropriate dopant species with an appropriate concentration to its purpose, is employed.

The following detailed description is, therefore, not to be taken in a limiting sense, and the scope of the present invention is defined only by the appended claims, along with the full scope of equivalents to which such claims are entitled.

FIG. 1A shows an embodiment of a circuit 100 that is responsive to an enable signal 102, supplied from an external source. The enable signal activates the output of the circuit 100. Circuit 100 comprises a first branch 104 and a second branch 106. In one embodiment, the first branch supplies a supply voltage at an output node 108, ramping the supply voltage up to a potential at or near the supply voltage for an appropriate circuit to be controlled by the output voltage, and the second branch supplies a pumped voltage above the supply voltage of the first branch.

First branch 104, when active, ramps the potential of output node 108 to at or near a supply voltage. When second branch 106 is active, it ramps the potential of the output node from the voltage at or near the supply voltage to a potential above the current output voltage using a pumped voltage supply. In one embodiment, the circuit switches from the first branch as a supply for the output node to the second branch as a supply for the output node once a predetermined threshold potential at the output node is reached. In another embodiment, the circuit switches from the first branch as a supply for the output node to the second branch as a supply for the output node once a predetermined time has elapsed with the first branch actively supplying a voltage to the output node. In one embodiment, the first branch ramps the output potential quickly to at or near the supply voltage.

Figure 1B:
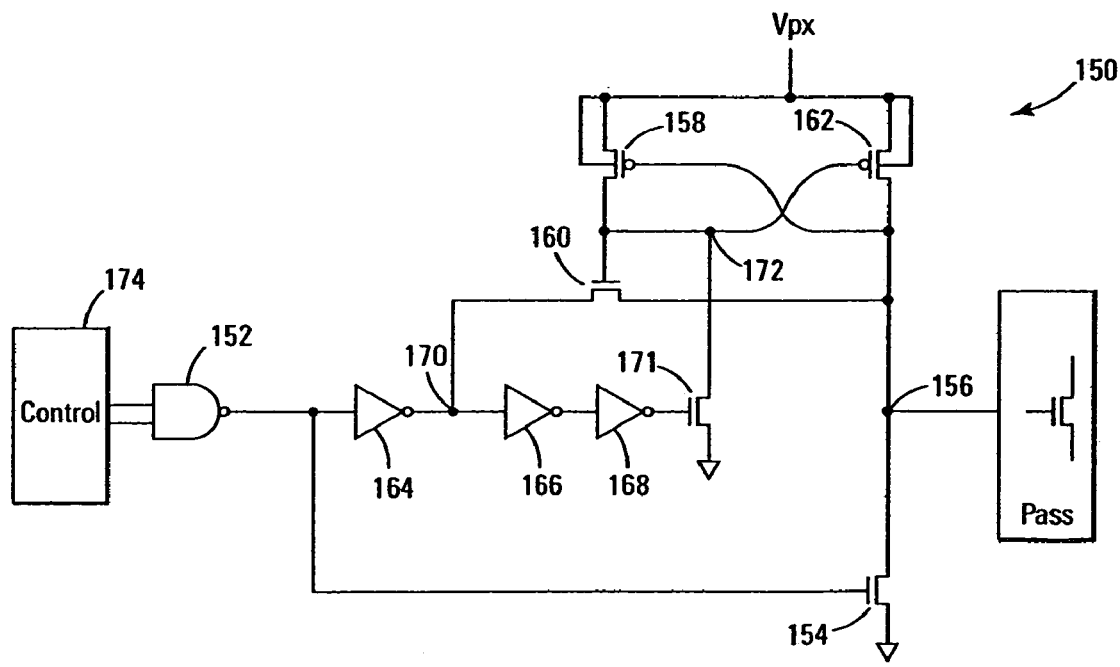
FIG. 1B is a circuit diagram of an embodiment of the present invention.

In one embodiment, a circuit 150 for providing an output voltage slightly above a supply voltage $V_{cc}$ from an elevated voltage, $V_{px}$ or $V_h$, is shown in FIG. 1B. $V_{px}$ is typically generated using a pump circuit (not shown) and is greater than $V_{cc}$. For purposes of the present invention, $V_{px}$ can be generated using any technique including an external supply. Circuit 150 includes a NAND gate 152 that has two inputs. When the inputs to the NAND gate 152 are in a state to provide a high output from the NAND gate, pull down transistor 154, which is gate connected to the NAND output, is turned on and the output voltage (node 156) is pulled to ground. The output node 156 is connected to the gate of p-type transistor 158, which when NAND output is high, is turned on and passes a high voltage through transistor 158 to the gate of pass transistor 160, which is therefore turned on.

The same high voltage at the gate of p-type transistor 162 keeps it off. The output of NAND gate 152 is passed through a series of first, second, and third inverters 164, 166, and 168, respectively. Inverter 164 output is low when NAND gate output is high, keeping a low potential at node 170 connected to pass transistor 160. The signal is inverted twice, in inverters 166 and 168, from low to high to low high again at the output from inverter 168. In a steady state, transistor 171 is off when NAND gate 152 output is high, keeping node 172 high due to the pass through of high potential through transistor 158.

Inverter 164 is in one embodiment a very strong PMOS inverter. The strength of the inverter 164 assists in raising the voltage at node 156 to near $V_{cc}$ in as fast a time as possible. The node 170 has an inherent rise time from its ground voltage to near $V_{cc}$ that depends upon the capacitance value seen at the node 156, that is the capacitance buildup due to the load at node 156. Node 170 rises with an RC time constant which is the time constant for node 156 to charge to $V_{cc}$.

The inputs to NAND gate 152 are provided by a pass transistor control circuit such as circuit 174 shown in FIG. 1B. Pass transistor control circuit determines when the output node voltage is to be supplied to the pass transistors, and is one embodiment dependent upon the control circuitry for a memory. When the pass transistors are to be turned on, the control circuit 174 issues inputs to the NAND gate to force the NAND gate output low. An enable circuit according to one embodiment comprises a control circuit such as circuit 174 coupled to a NAND gate such as gate 152.

When the output of NAND gate 152 switches to low, transistor 154 shuts off. Inverter 164 generates a high signal at node 170 which is very quickly passed through pass transistor 160 as pass transistor 160 is already on as discussed above. In one embodiment, the inverter 164 is a large inverter. In this embodiment, the size of inverter 164 creates a strong and fast ramp up of the voltage at the output node 156 to near $V_{cc}$. As the voltage ramps up to $V_{cc}$ at output node 156, the increasing voltage begins to and eventually fully shuts off transistor 158. The output from inverter 164 also passes through time delay inverters 166 and 168, which in one embodiment are chosen in size to be trip point detectors. The first inverter 166 in one embodiment has a skewed trip point. Inverter 166 does not trip until its input nears $V_{cc}$, for example, and then it trips the inverter 168 for an additional delay before switching off the pass transistor 160 by operation of the pull down transistor 171. The delays can therefore be chosen to allow the output node voltage to rise to near $V_{cc}$ without using current from the pumped voltage $V_{px}$.

The delay on inverters 166 and 168 is controlled by the rise time of node 170. For example, a typical rise time for nodes 156 and 170 to charge to $V_{cc}$ is about two (2) nanoseconds. In one embodiment, the delays for the inverters are about 200 picoseconds each. The trip point of inverter 166 is set high in one embodiment, and the inverter will not trip until about one (1) nanosecond has elapsed. The inverters 166 and 168 are in other words a detector. The line voltage at node 170 has to reach a certain threshold before the inverter 166 trips.

The trip points of inverters 166 and 168 are chosen in one embodiment to allow the output node to charge to a predetermined potential level at or near $V_{cc}$ before switching off pass transistor 160 and completing a ramp to a potential above $V_{cc}$ using smaller transistor 162 which draws current from the pumped voltage supply ($V_{px}$) as opposed to the supply voltage ($V_{cc}$).

Once the output signal from inverter 164 passes through the inverters 166 and 168, a high signal is presented at the gate of transistor 171, which turns transistor 171 on, pulling node 172 to ground and shutting off pass transistor 160. The low potential at node 172 turns on transistor 162, and transistor 162 passes pumped voltage $V_{px}$ to output node 156. However, since the output node 156 is already at or near $V_{cc}$, due to the ramp up from inverter 164 during the time delay for shutting off pass transistor 160, the pumped voltage only has to provide enough current to pull up node 156 from $V_{cc}$ to a point slightly above $V_{cc}$, for example a threshold voltage, $V_t$, above $V_{cc}$, instead of a full potential of on the order of 5 volts.

The circuit ramps the output node 156 voltage quickly to at or near $V_{cc}$ without relying on the pumped voltage, drawing most of its required current from $V_{cc}$. The large inverter assists in ramping the output node voltage quickly to at or near $V_{cc}$. When the output voltage reaches or nears $V_{cc}$, depending upon the selectable timing from inverters 166 and 168, the remaining voltage necessary above $V_{cc}$ is supplied by drawing on $V_{px}$, but the initial ramp in the output node voltage is supplied by $V_{cc}$.

A driver for the gates of pass transistors comprises in one embodiment a circuit driven by $V_{px}$. When the circuit is disabled, that is the memory is not in a read cycle, the output of the driver is a ground voltage so that the gates of the pass transistors it drives are off. The circuit is ready during its disable phase to quickly pass a supply voltage $V_{cc}$ to the output when the circuit is enabled, and to use a pumped voltage to raise the output voltage above $V_{cc}$ once it gets close to $V_{cc}$, but without requiring a large current draw from the pumped voltage which supplies the driver. The driver of the present embodiments obtains most of its current from the supply voltage, and only relies on the pumped voltage for the extra current to push the output above the supply voltage. It is sufficient to drive the output voltage slightly above $V_{cc}$, such as to about a threshold voltage $V_t$ above $V_{cc}$. Current usage from the pumped voltage drops to about 1/7 to 1/8 of previous solutions.

Figure 2:
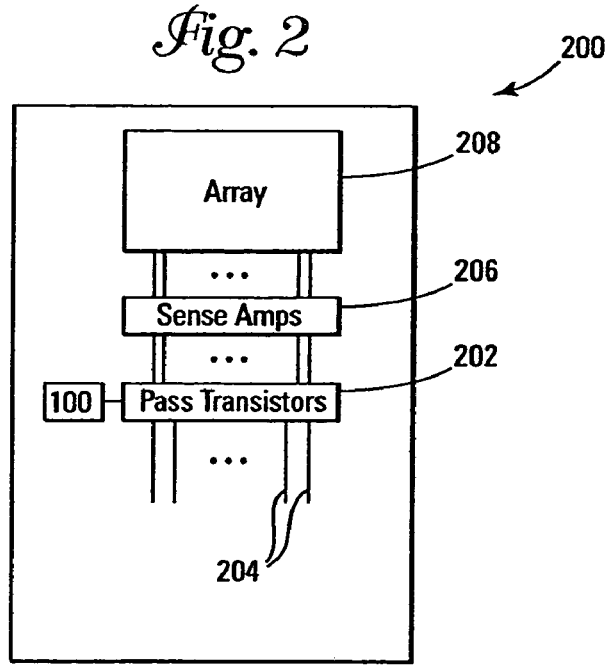
FIG. 2 is a block diagram of a memory according to an embodiment if the present invention.

Flash memories using a voltage sensing in order to perform read and write operations are amenable to use with the driver described above. In one embodiment, a driver such as that described above provides the gate voltage for the pass transistors 202 of memory device 200 as is shown in FIG. 2. The pass transistors connect global bitlines 204 to sense amplifiers 206 of memory device 200. Memory array 208 is read through the use of the sense amps as is well known in the art. A driver circuit, such as driver circuit 150 described above, provides the gate voltage for the pass transistors. The driver provides a supply voltage nearly immediately upon enabling of the driver circuit. The driver circuit then provides a voltage slightly above the supply voltage, delayed to allow the voltage to rise to at or near $V_{cc}$, after the gate voltage ramps up to at or near $V_{cc}$ without requiring a drain on the current of the pumped voltage that supplies the driver circuit.

Figure 3:
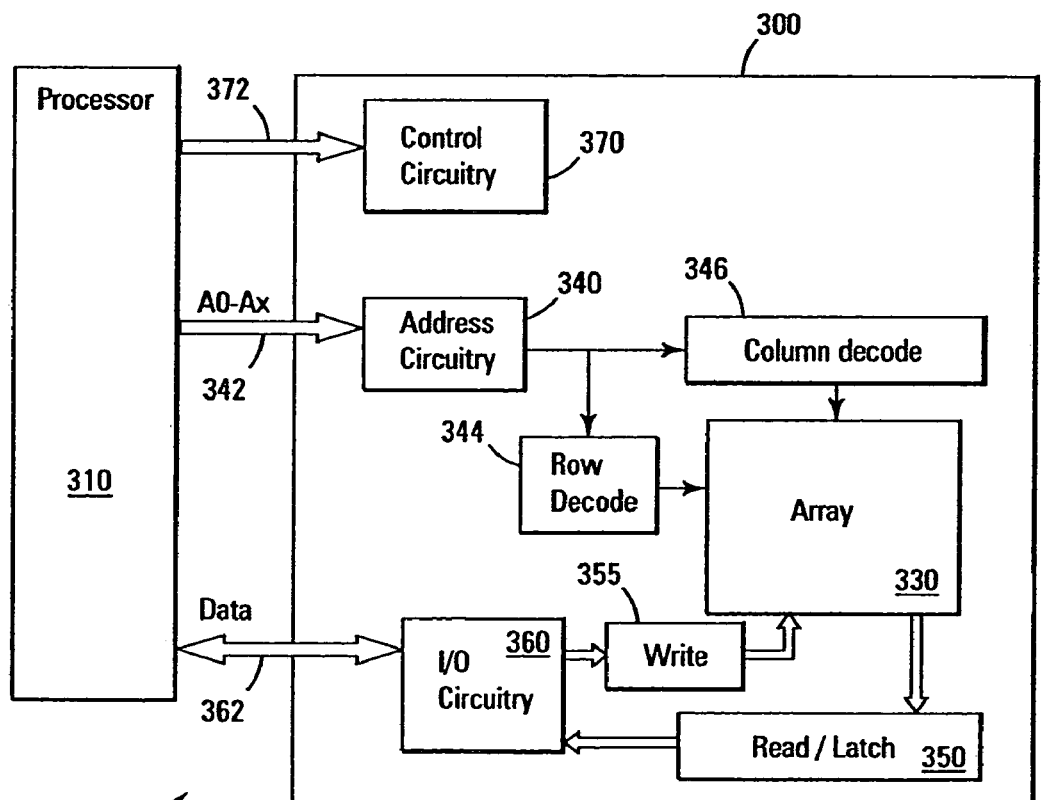
FIG. 3 is a block diagram of a memory according to another embodiment of the present invention.

FIG. 3 is a functional block diagram of a memory device 300, of one embodiment of the present invention, which is coupled to a processor 310. The memory device 300 and the processor 310 may form part of an electronic system 320. The memory device 300 has been simplified to focus on features of the memory that are helpful in understanding the present invention. The memory device includes an array of memory cells 330. The memory array 330 is arranged in banks of rows and columns.

An address buffer circuit 340 is provided to latch address signals provided on address input connections A0–Ax 342. Address signals are received and decoded by row decoder 344 and a column decoder 346 to access the memory array 330. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 330 by sensing voltage or current changes in the memory array columns using sense/latch circuitry 350. The sense/latch circuitry, in one embodiment, is coupled to read and latch a row of data from the memory array. Sense/latch circuitry 350 in one embodiment includes a driver circuit for the pass transistors of the sense/latch circuitry, such as that described above. Data input and output buffer circuitry 360 is included for bi-directional data communication over a plurality of data (DQ) connections 362 with the processor 310.

Command control circuit 370 decodes signals provided on control connections 372 from the processor 310. These signals are used to control the operations on the memory array 330, including data read, data write, and erase operations. The flash memory device has been simplified to facilitate a basic understanding of the features of the memory. A more detailed understanding of internal circuitry and functions of flash memories are known to those skilled in the art.

Finally, it will be understood that the number, relative size and spacing of the structures depicted in the accompanying figures are exemplary only, and thus were selected for ease of explanation and understanding. Therefore such representations are not indicative of the actual number or relative size and spacing of an operative embodiment in accordance with the present invention.

CONCLUSION

A driver for a flash memory has been described that includes a combined voltage obtained mostly from a supply voltage, and only partially from a pumped voltage, so as to not tax the pumped voltage by drawing too much current therefrom.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A processing system, comprising:
   a processor; and
   a memory coupled to the processor to store data provided by the processor and to provide data to the processor, the memory comprising:
   an array of memory cells;
   control circuitry to read, write and erase the memory cells;
   address circuitry to latch address signals provided on address input connections; and
   a driver for the array, comprising:
   an enable circuit providing an enable signal;
   a pull down transistor having its gate connected to the enable signal, to ground an output node when the enable signal is disabled;
   a pass transistor having its gate connected through a first p-type pull-up transistor connected between a pumped voltage and the gate of the pass transistor;
   an inverter connected between the enable circuit output and the pass transistor;
   a second pull down transistor connected between ground and the gate of the pass transistor;
   a series connection of two inverters connected between the output of the first inverter and the gate of the second pull down transistor; and
   a second p-type transistor connected between the pumped voltage and the output node, the gate of the second p-type transistor connected to the gate of the pass transistor.

2. The processing system of claim 1, wherein the pass transistor is very large compared to the second p-type transistor.

3. The processing system of claim 1, wherein the first inverter is very large compared to the second and the third inverters.

4. The processing system of claim 1, wherein the pumped voltage is at least a threshold voltage above the supply voltage.

5. The processing system of claim 1, wherein the second and third inverters are selected as trip point inverters to delay a turn on of the second p-type transistor until after turn on of the pass transistor.

6. The processing system of claim 1, wherein the enable circuit comprises:
   a NAND gate; and
   a control circuit providing inputs to the NAND gate.

7. A processing system, comprising:
   a processor; and
   a memory coupled to the processor to store data provided by the processor and to provide data to the processor, the memory comprising:
   an array of memory cells;
   control circuitry, including a pass transistor block to control access to the memory during an active cycle, to read, write and erase the memory cells; and
   a driver circuit to control operation of the pass transistor block, the driver circuit comprising:
   a first path for providing a supply voltage to an output node upon initiation of a read cycle; and
   a second path for providing a pumped voltage above the supply
   voltage after providing the supply voltage.

8. The processing system of claim 7, wherein the first path comprises a large pass transistor connected to a supply voltage, the pass transistor passing the supply voltage to the output node.

9. The processing system of claim 7, wherein the second path comprises a small pass transistor passing the pumped voltage to the output node after the pass transistor passes the supply voltage to the output node.

10. The processing system of claim 7, and further comprising:
    a pair of delay inverters, the delay inverters delaying the turn on of the small pass transistor for a predetermined time from when the pass transistor begins passing the supply voltage.

11. A processing system, comprising:
    a processor; and
    a flash memory device coupled to the processor to store data provided by the processor and to provide data to the processor, the memory comprising:
    an array of floating gate memory cells; and
    control circuitry to read, write and erase the floating gate memory cells; and
    a driver circuit to control read access, the driver circuit comprising:
    a NAND gate providing a read signal;
    a pull down transistor having its gate connected to the read signal, to ground an output node when the read signal is disabled;
    a pass transistor having its gate connected through a first p-type pull-up transistor connected between a pumped voltage and the gate of the pass transistor;
    an inverter connected between the NAND gate output and the pass transistor;
    a second pull down transistor connected between ground and the gate of the pass transistor;

a series connection of two inverters connected between the output of the first inverter and the gate of the second pull down transistor; and a second p-type transistor connected between the pumped voltage and the output node, the gate of the second p-type transistor connected to the gate of the pass transistor.

12. The processing system of claim 11, wherein the pass transistor is very large compared to the second p-type transistor.

13. The processing system of claim 11, wherein the first inverter is very large compared to the second and the third inverters.

14. The processing system of claim 11, wherein the pumped voltage is at least a threshold voltage above the supply voltage.

15. A processing system, comprising:
a processor; and
a memory coupled to the processor to store data provided by the processor and to provide data to the processor, the memory comprising:
an array of memory cells;
control circuitry, including a pass transistor block to control access to the memory during an active cycle, to read, write and erase the memory cells; and
a circuit for providing an output voltage at an output node to selectively control a gate of a pass transistor of the pass transistor block, the circuit comprising:
first and second branches, the first branch coupled to the output node to raise a potential at the output node to approximately a supply voltage, and the second branch coupled to the output node once the output node voltage has reached a predetermined potential threshold, to raise the potential of the output node above the threshold using a pumped voltage.

16. The processing system of claim 15, wherein the first branch comprises:

an inverter; and
a pass gate connected to pass the inverter output to the output node.

17. The processing system of claim 15, wherein the second branch comprises:
a p-type transistor connected between the pumped voltage and the output node to pass the pumped voltage to the output node.

18. The processing system of claim 17, wherein the second branch further comprises:
a pair of trip point inverters to delay a turn on of the p-type transistor until the output voltage reaches the predetermined potential.

19. The processing system of claim 15, wherein the first branch comprises:
a first inverter; and
a pass gate connected to pass the first inverter output to the output node; and
wherein the second branch comprises:
a p-type transistor connected between the pumped voltage and the output node to pass the pumped voltage to the output node; and
second and third inverters connected to delay turn on of the p-type transistor.

20. The processing system of claim 19, wherein the pass gate is very large compared to the p-type transistor.

21. The processing system of claim 19, wherein the first inverter is very large compared to the second and the third inverters.

22. The processing system of claim 19, wherein the pumped voltage is at least a threshold voltage above the supply voltage.

23. The processing system of claim 15, wherein the second and third inverters are selected as trip point inverters to delay a turn on of the second p-type transistor until after turn on of the pass transistor.

* * * * *